United States Patent
Bleiziffer et al.

(10) Patent No.: US 11,624,673 B2
(45) Date of Patent: Apr. 11, 2023

(54) CONNECTING DEVICE FOR CONNECTING A SENSOR TO A UNIT CONTAINING A FLUID

(71) Applicant: Sick AG, Waldkirch (DE)

(72) Inventors: Markus Bleiziffer, Waldkirch (DE); Thomas Graner, Waldkirch (DE); Martin Urban, Lörrach (DE)

(73) Assignee: SICK AG, Waldkirch (DE)

( * ) Notice: Subject to any disclaimer, the term of this patent is extended or adjusted under 35 U.S.C. 154(b) by 0 days.

(21) Appl. No.: 17/380,430

(22) Filed: Jul. 20, 2021

(65) Prior Publication Data
US 2022/0026304 A1  Jan. 27, 2022

(30) Foreign Application Priority Data
Jul. 21, 2020 (EP) .................................. 20186872

(51) Int. Cl.
*G01M 3/18* (2006.01)
*G01D 11/30* (2006.01)
*G01R 1/04* (2006.01)

(52) U.S. Cl.
CPC ............. *G01M 3/186* (2013.01); *G01D 11/30* (2013.01); *G01R 1/04* (2013.01)

(58) Field of Classification Search
None
See application file for complete search history.

(56) References Cited

U.S. PATENT DOCUMENTS

| 5,869,766 A * | 2/1999 | Cucci .................... G01L 9/0075 73/756 |
| 2006/0090567 A1* | 5/2006 | Shamine .............. F02M 65/003 73/729.2 |
| 2012/0006297 A1* | 1/2012 | Worthington ........ F02M 55/025 123/456 |

(Continued)

FOREIGN PATENT DOCUMENTS

DE   10 2005 043 346 A1   5/2006

OTHER PUBLICATIONS

European Search Report dated Dec. 22, 2020 for application No. EP 20186872.6.

(Continued)

*Primary Examiner* — Paul M. West
*Assistant Examiner* — Mark A Shabman
(74) *Attorney, Agent, or Firm* — Nath, Goldberg & Meyer; Jerald L. Meyer

(57) ABSTRACT

To enable easy alignment of a leakage outlet according to known guidelines, a connecting device (1) for connecting a sensor (3) to a unit (2) containing a fluid is provided, comprising a first mounting portion (1a) to which the sensor (3) is mountable, a second mounting portion (1b) which is mountable to the unit (2), a central portion (1c) located between the first and second mounting portions (1a and 1b) and a leakage ring (1e) covering the bore (1d) of the central portion (1c), the leakage ring (1e) being sealed and rotatable relative to the central portion (1c), wherein the leakage ring (1e) has a leakage outlet (1f) on its periphery, the leakage outlet (1f) being provided to be located in the region of a lowest position of the periphery of the leakage ring (1e) in an operating position to allow any fluid present to drain.

7 Claims, 3 Drawing Sheets

(56) References Cited

U.S. PATENT DOCUMENTS

Figure 1:
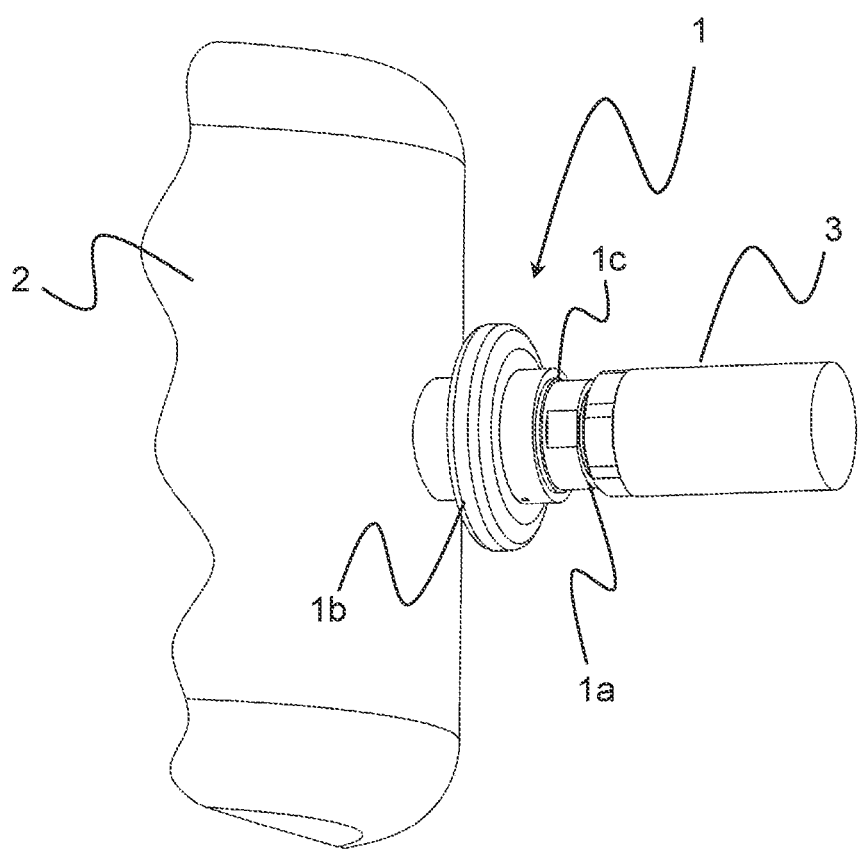

2017/0268910 A1  9/2017  Schneider et al.

OTHER PUBLICATIONS

Filton: ,,Rotary Unions Swivel Joints Manufactured in the UK with over 70 Years Experience, Dec. 31, 2016 (Dec. 31, 2016), Seiten 1-36, XP055885579, Found on the Internet: URL:https://www.filton.com/uploads/DOCS5344FE551F218.pdf [found on Jan. 31, 2022].

* cited by examiner

CONNECTING DEVICE FOR CONNECTING A SENSOR TO A UNIT CONTAINING A FLUID

The invention relates to a connecting device for connecting a sensor to a unit containing a fluid, comprising a first mounting portion to which the sensor is mountable, a second mounting portion mountable to the unit, a central portion located between the first and second mounting portions and having at least one hole on its periphery for draining any unwanted fluid present to drain off.

In today's industry, almost all units used, such as machines or containers, are monitored by means of sensors. A use of the sensors may be specified by guidelines or standards, which must be complied with when designing the use of the sensors.

When connecting a sensor in the food industry or in sterile applications, it is necessary to avoid microbiological contamination. Such contamination can occur when fluid or liquid enters and remains in a dead space. Therefore, if seals or diaphragms are used to separate the dead space from a product area, a leakage indicator must be provided. In this case, the leakage indicator must be positioned at the lowest possible point because of the downward flow of leaking fluid. In the simplest case, the leakage indicator consists of a leakage hole from which the leaking fluid can (visibly) escape. In this context, dead space means a cavity between the unit and the sensor into which leaking fluid can enter from the unit.

This positioning of the leakage hole is not always possible, because if the leakage hole is provided on the sensor and if the sensor is to be screwed to the unit, the final position of the leakage hole and the positions of possible sensor connections are not selectable because they depend on an ending of a thread. On the other hand, the required lowest position of the leakage hole can be ensured in such a way that the leakage hole is fixed to the unit, for example by appropriate welding. In this case, however, a rotational alignment of the sensor to be screwed to the unit is not possible, so that the rotational position of the sensor is then purely random and, for example, in particular a readability of a display of the sensor and/or a cabling is made difficult, because the display is positioned at an angle unfavorable for reading, or corresponding connections of the sensor for the cabling are located in an unfavorable position.

It is an object of the invention to provide a connecting device for connecting a sensor to a unit containing a fluid, with which it is possible to easily align a leakage outlet taking into account an orientation of the sensor.

The objective is solved according to the inventive subject matter by a connecting device for connecting a sensor to a unit containing a fluid with the following features. The connecting device for connecting a sensor to a unit containing a fluid comprises a first mounting portion to which the sensor is mountable, a second mounting portion which is mountable to the unit, a central area located between the first and second mounting portions, having at least one bore on its periphery, and a leakage ring covering the bore of the central portion, the leakage ring being sealed and rotatable relative to the central portion wherein the leakage ring has a leakage outlet on its periphery. By rotating the leakage ring the leakage outlet can be provided to be located in the region of a lowest position of the periphery of the leakage ring in an operating position to allow any fluid present to drain off.

This results the advantage is achieved that a simple alignment of the leakage outlet by means of the leakage ring being rotatable, allows at the same time and independently thereof, a simple alignment of the display of the sensor in an optimal position, for example for a readability of a display of the sensor or for a wiring of the sensor.

Advantageously, the unit containing the fluid comprises a tank, a pipe, a fitting or the like.

According to a preferred embodiment, the first mounting portion comprises a screw connection. This makes it very easy to mount the connecting device to the unit containing the fluid.

Furthermore, according to another preferred embodiment, the second mounting portion comprises a flanged connection, in particular a tri-clamp connection, whereby mounting the connecting device to the unit and aligning the sensor by rotating the connecting device together with the sensor is particularly simplified.

Furthermore, it is advantageous that the connection of the first mounting portion to the sensor and the connection of the second mounting portion to the unit are hermetically sealed.

The objective underlying the invention is further solved by a method for mounting a sensor by means of a connecting device to a unit containing a fluid, in that the method comprises the steps:

(a) Mounting the sensor to a first mounting portion of the connecting device and mounting a second mounting portion of the connecting device to the unit,
b) Aligning the sensor to a desired position of the sensor,
(c) Rotating a leakage ring of the connecting device to locate a leakage outlet provided on a periphery of a leakage ring to a region of a lowest position of the periphery of the leakage ring in an operating position.

This results in the advantage that both, the leakage outlet can be positioned at the lowest point of the connection according to the guideline or standard norm, and the sensor can be optimally aligned with regard to its readability or its cabling accessibility.

Figure 2:
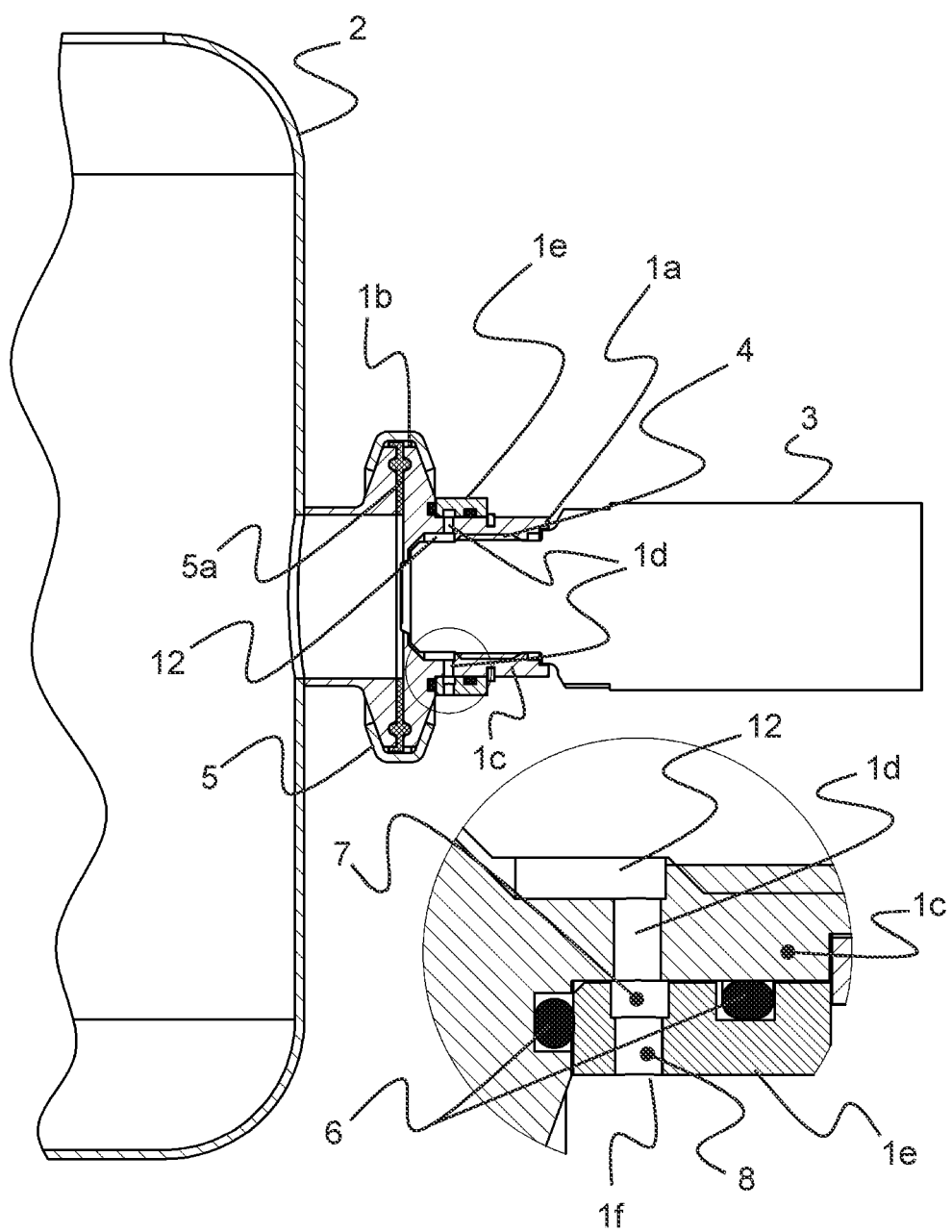
Figure 3:
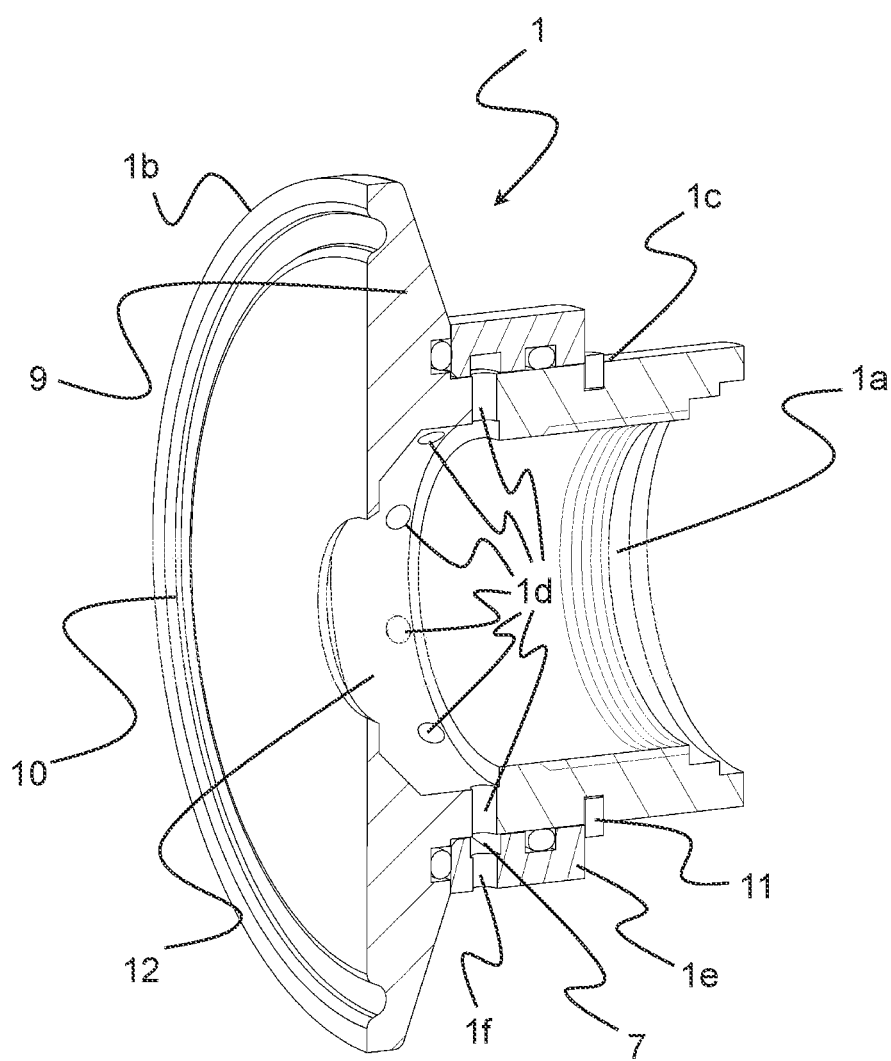

The invention is also explained below with respect to further advantages and features with reference to the accompanying drawing by way of examples of embodiments. The figures of the drawing show in:

FIG. 1 a schematic perspective partial view of a unit connected to a sensor by means of a connecting device according to the invention, FIG. 2a schematic sectional view of the embodiment shown in FIG. 1, FIG. 2b magnified detailed view of a leakage outlet, and FIG. 3 perspective sectional view of a preferred embodiment of the connecting device.

FIG. 1 shows schematically a partial view of a unit 2 containing a fluid, the contents of the unit 2 are measured by a sensor 3. The unit 2 comprises in particular a container containing a fluid, a tank, a pipeline, a fitting or the like, wherein the sensor 3 determines a pressure, a temperature or any other physical quantity inside the unit 2.

The sensor 3 is connected to the unit 2 by means of a connecting device 1 according to the invention.

The connecting device 1 comprises a first mounting portion 1a to which the sensor 3 is mountable. Further, the connecting device 1 comprises a second mounting portion 1b mountable to the unit 2. Between the first mounting portion 1a and the second mounting portions 1b is a central portion 1c located, which has at least one bore 1d on its periphery as shown in FIG. 2a. Therefore, it is possible that liquid unintentionally flowing out or leaking from the unit 2 can drain through one of the bores 1d.

According to the inventive subject matter, the connecting device 1 comprises a leakage ring 1e covering the bore 1d of the central portion 1c. The leakage ring 1e is sealed and rotatable with respect to the central portion 1c, the leakage ring 1e having a leakage outlet 1f on its periphery. The leakage outlet 1f is provided to be disposed in a region of a lowest position of the circumference of the leakage ring 1e in an operating position. By this, it is possible that the sensor 3 can be mounted in an optimum position to the unit 2 by rotating the connecting device 1 regardless of the position of the leakage outlet 1f, and the leakage outlet 1f of the leakage ring 1e can be easily adjusted in the range of a lowermost position or to the lowermost position in the operating position according to a specification of a guideline or a standard by rotating the same.

FIG. 2a shows a schematic sectional view of the embodiment shown in FIG. 1. The first mounting portion 1a preferably comprises a screw connection 4, which allows the sensor 3 to be easily screwed to the connecting device 1. The second mounting portion 1b comprises a flange connection 5, in particular a tri-clamp connection, whereby the connecting device 1 together with the sensor 3 can be very easily attached to the unit 2. Here, the sensor 3 can be adjusted to an optimal position with respect to a readability of its display or its cable feed or wiring by simply rotating the connecting device 1. After the alignment of the sensor 3, the leakage outlet 1f can be brought into the intended operating position by simply turning the leakage ring 1e.

Both the connection between the first mounting portion 1a and the sensor 3 and between the second mounting portion 1b and the unit 2 are hermetically sealed. On the side of the first mounting portion 1a, the tightness is ensured by the screw connection 4. On the side of the second mounting portion 1b, the tightness of the flange connection 5, in particular the tri-clamp connection, is established by a sealing arrangement 5a. The sealing arrangement 5a comprises, for example, a sealing membrane which seals the unit 2 with respect to the sensor 3.

In the case that a tightness of the sealing arrangement 5a or the sealing diaphragm is not ensured, liquid of the unit 2 may unintentionally enter a collecting groove 12 and drain through the bore 1d. The collecting groove 12 is provided on an inner side of the central portion 1c of the connecting device 1, and connects all the bores 1d of the central portion 1c with each other.

As shown from the enlarged detailed view of the leakage outlet 1f of the leakage ring 1e in FIG. 2b, the leakage ring 1e is sealed by means of two seals 6 with respect to the central area 1c of the connecting device 1. Despite the two seals 6, the leakage ring 1e is rotatable relative to the central area 1c of the connecting device 1. Here, the leakage ring 1e has, in particular on an inner side, a circumferential groove 7 which is formed wider than the bore 1d of the central portion 1c of the connecting device 1 and covers all bores 1d of the central portion 1c. A radially outwardly directed outlet bore 8 is connected to the groove 7, so that the groove 7 together with the outlet bore 8 forms the leakage outlet 1f of the leakage ring 1e.

Due to the fact that the groove 7 covers all of the bores 1d of the central area 1c and the outlet bore 8 connected to the groove 7 is located in the area of the lowest position of the leakage ring 1e, the liquid unintentionally leaking from the unit 2 can leak through one of the bores 1d of the central area 1c and ultimately flow out through the outlet bore 8 via the groove 7.

FIG. 3 shows a perspective sectional view of a preferred embodiment of the connecting device 1, without the unit 2 and the sensor 3. The first mounting portion 1a has a thread with which the sensor 3 can be mounted to the connecting device 1. Here, instead of the thread, a smooth shoulder for an interference fit of the sensor 3 to the connecting device 1 may be provided on the side of the first mounting portion 1a.

The second mounting portion 1b comprises a flange 9 with which the tri-clamp connection can be made. The flange 9 has a groove 10 in which the sealing arrangement 5a is provided. As shown in the preferred embodiment, the central portion 1c has ten bores 1d, wherein leaking fluid can drain through at least one of the bores 1d. All of the bores 1d are connected to each other on the inner side of the central portion 1c via the collecting groove 12, so that a cavity is formed between the inner side of the central portion 1c and an outer surface of the sensor 3, into which liquid can enter from the unit 2, for example, due to a leakage of the sealing arrangement 5a.

The leakage ring 1e completely covers the bores 1d with its groove 7, so that the unintentionally leaking liquid can only flow into the groove 7 of the leakage ring 1e. Through the leakage outlet 1f of the leakage ring 1e, the liquid can drain to atmosphere, so that the leakage can be indicated to a user in this way.

Further, the leakage ring 1e is in contact with the flange 9 of the second mounting portion 1b on one side and with a retaining ring 11 on the other side, so that the leakage ring 1e is rotatably held in position.

An assembly of the above connecting device 1 is performed as follows. The sensor 3 is connected to the first mounting portion 1a of the connecting device 1 in a step a). Here, the connection can be made either by screwing or by pressing the sensor 3 onto the first mounting portion 1a. The second mounting portion 1b is connected to the unit 2 by means of the flange connection 5. Of course, the connecting device 1 can also be connected to the unit 2 first and only then to the sensor 3.

After connecting the connecting device 1 to the unit 2 and the sensor 3, the sensor 3 is aligned, by rotating the connecting device 1 about the central portion 1c in a step b), in a desired position such that, for example, a reading of a display of the sensor 3 can be easily performed or connections of the sensor 3 are aligned such that a simple wiring of the sensor 3 can be performed.

When the sensor 3 is aligned, in a step c) the leakage ring 1e is rotated so that the leakage outlet 1f is located in an area or at the lowest position of the circumference of the leakage ring 1e in the operating position. This makes it easy to meet a standard requirement, for example of the food industry, of positioning a leakage indicator at the lowest possible position of the connection between the sensor 3 and the unit 2 containing the fluid.

Additionally, the sensor 3 remains adjustable in position so that as needed, for example for better readability or for ease of wiring the sensor 3, the sensor 3 can be aligned after connection to the unit 2 without having to give up the lowest location of the leakage outlet 1f in the operating position.

LIST OF REFERENCE SIGNS

1 Connecting device
1a First mounting portion
1b Second mounting portion
1c Central portion
1d Bore
1e Leakage ring
1f Leakage outlet
2 Unit
3 Sensor
4 Screw connection
5 Flange connection 5a Sealing arrangement
6 Seals
7 Groove
8 Outlet bore
9 Flange
10 Groove
11 Retaining ring
12 Collecting groove

The invention claimed is:

1. A connecting device (1) for connecting a sensor (3) to a unit (2) containing a fluid, comprising:
   a first mounting portion (1a) to which the sensor (3) is mountable;
   a second mounting portion (1b) mountable to the unit (2);
   a central portion (1c) located between the first and second mounting portions (1a, 1b) and having at least one hole (1d) on its periphery; and
   a leakage ring (1e) covering the central portion (1c), the leakage ring (1e) being sealed with respect to the central portion (1c) and further being rotatable with respect to the central portion (1c), the leakage ring (1e) having a leakage outlet (1f) on a periphery thereof,
   wherein the leakage ring (1e) is configured to be rotatable after alignment of the sensor (3) by rotation of the connecting device (1), wherein by rotating the leakage ring (1e) relative to the central portion (1c), the leakage outlet (1f) is arranged in a region of a lowest position of the periphery of the leakage ring (1e) and in an operating position such that any fluid present can drain, and
   wherein the central portion (1c) has a plurality of holes on the periphery thereof.

2. The connecting device (1) according to claim 1, wherein the unit (2) containing the fluid comprises a tank, a pipe, or a fitting or the like.

3. The connecting device (1) according to claim 1, wherein the first mounting portion (1a) comprises a screw connection (4).

4. The connecting device (1) according to claim 1, wherein the second mounting portion (1b) comprises a flange connection (5).

5. The connecting device (1) according to claim 4, wherein the second mounting portion (1b) comprises a tri-clamp connection.

6. The connecting device (1) according to claim 1, wherein the connection of the first mounting portion (1a) to the sensor (3) and the connection of the second mounting portion (1b) to the unit (2) are each hermetically sealed.

7. A method of mounting a sensor (3) by means of a connecting device (1) according to claim 1 to a unit (2) containing a fluid, comprising the steps:
   a) mounting the sensor (3) to the first mounting portion (1a) of the connecting device (1) and mounting the second mounting portion (1b) of the connecting device (1) to the unit (2);
   b) aligning the sensor (3) to a desired position of the sensor (3);
   c) rotating the leakage ring (1e) of the connecting device (1) to arrange the leakage outlet (1f) provided on the periphery of the leakage ring (1e) in the region of the lowest position of the periphery of the leakage ring (1e) in the operating position.

* * * * *

UNITED STATES PATENT AND TRADEMARK OFFICE
CERTIFICATE OF CORRECTION

PATENT NO. : 11,624,673 B2
APPLICATION NO. : 17/380430
DATED : April 11, 2023
INVENTOR(S) : Markus Bleiziffer, Thomas Graner and Martin Urban Page 1 of 1

It is certified that error appears in the above-identified patent and that said Letters Patent is hereby corrected as shown below:

In the Claims

Claim 1, Column 5, Lines 16-17, please remove the phrase "and having at least one hole (1d) on its periphery".
Claim 2, Column 6, Line 3, please remove the phrase "or the like".

Signed and Sealed this
Twenty-third Day of May, 2023

Katherine Kelly Vidal
*Director of the United States Patent and Trademark Office*